(12) United States Patent
Watanabe et al.

(10) Patent No.: US 8,737,440 B2
(45) Date of Patent: May 27, 2014

(54) OPTICAL MODULE WITH ENHANCED ROBUSTNESS OF TEMPERATURE CONTROLLING DEVICE

(75) Inventors: Toru Watanabe, Yokohama (JP);
Yasuyuki Yamauchi, Yokohama (JP);
Yoshihiro Tateiwa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/967,946

(22) Filed: Dec. 14, 2010

(65) Prior Publication Data

US 2011/0142086 A1 Jun. 16, 2011

(30) Foreign Application Priority Data

Dec. 15, 2009 (JP) ................. 2009-284480

(51) Int. Cl.
*H01S 5/024* (2006.01)
*H01S 5/02* (2006.01)
*H01L 23/00* (2006.01)

(52) U.S. Cl.
USPC .......................................... 372/34; 372/108

(58) Field of Classification Search
USPC .................................. 372/34, 108
See application file for complete search history.

(56) References Cited

U.S. PATENT DOCUMENTS

| 7,103,284 B2 * | 9/2006 | Oomori et al. ................. 398/182 |
| 2001/0033592 A1 * | 10/2001 | Yamauchi et al. .............. 372/50 |

FOREIGN PATENT DOCUMENTS

| JP | H01-086260 U | 6/1989 |
| JP | H02-197185 A | 8/1990 |
| JP | H03-259584 A | 11/1991 |
| JP | H06-216466 A | 8/1994 |
| JP | H08-125282 A | 5/1996 |
| JP | H09-026532 A | 1/1997 |
| JP | H01-192188 A | 8/1999 |
| JP | 2000-352642 A | 12/2000 |
| JP | 2004-078205 A | 3/2004 |
| JP | 2004-301873 A | 10/2004 |
| JP | 2009-103988 A | 5/2009 |
| JP | 2009-230032 | 10/2009 |

OTHER PUBLICATIONS

Notification of Reasons for Rejection issued in related Japanese Patent Application No. 2009-284480 on Nov. 26, 2013.

* cited by examiner

*Primary Examiner* — Jessica Stultz
*Assistant Examiner* — Marcia Golub-Miller
(74) *Attorney, Agent, or Firm* — Venable LLP; Michael A. Sartori; Steven J. Schwarz

(57) ABSTRACT

An optical assembly (OSA) that installs a semiconductor optical device mounted on a thermo-electric controller (TEC) is disclosed. The TEC in the upper plate thereof is mechanically connected to the housing, or to the block stiffly fixed to the housing by a bridge made of stiff material. The bridge preferably extends along the optical axis to show enhanced durability against the impact caused by an external ferrule abutting against the receptacle of the OSA.

5 Claims, 6 Drawing Sheets

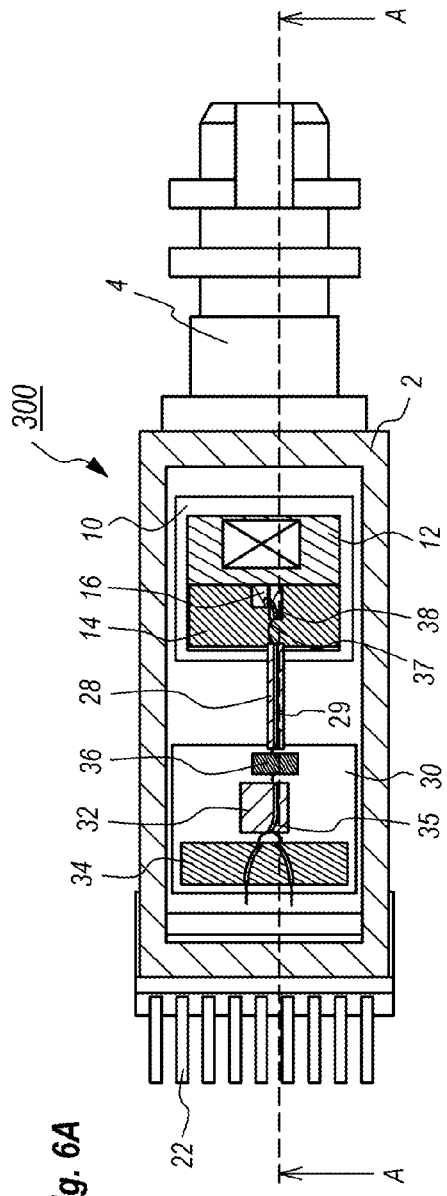
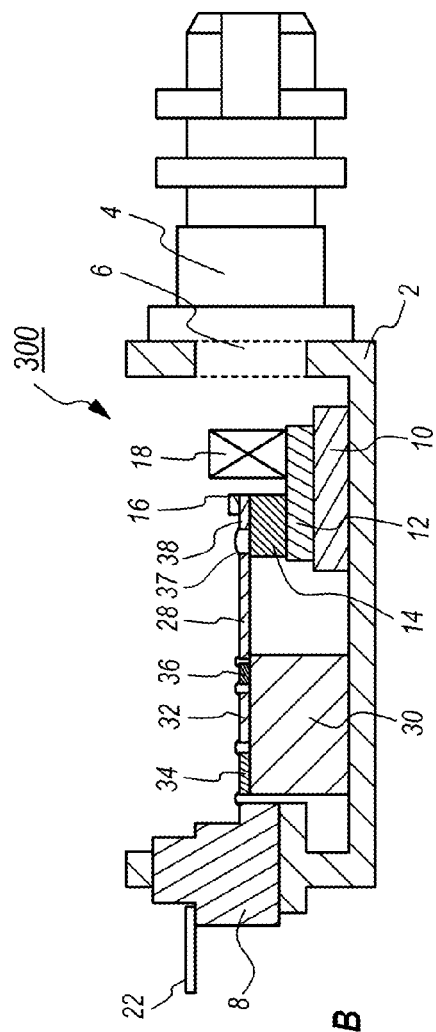

OPTICAL MODULE WITH ENHANCED ROBUSTNESS OF TEMPERATURE CONTROLLING DEVICE

BACKGROUND OF THE INVENTION

1. Field of the Invention

The present invention relates to an optical module installing a light-emitting device typically a semiconductor laser diode (hereafter denoted as LD), in particular, the invention relates to an optical module that installs a temperature controlling (hereafter denoted as TEC) device to control the temperature of the light-emitting device.

2. Related Prior Art

One type of an optical module has been knows as an optical sub-assembly (hereafter denoted as OSA) that includes an optical device such as LD and a coupling mechanism including a receptacle to couple the LD with an external fiber. A Japanese Patent Application published as JP-2009-230032A has disclosed such an OSA.

The OSA disclosed in a prior patent mentioned above installs a thermo-electric controller (hereafter denoted as TEC) to control a temperature of the LD mounted on the TEC. However, the TEC is often broken by slight external impact.

SUMMARY OF THE INVENTION

An optical sub-assembly according to the present invention comprises a housing, a TEC, a receptacle and a bridge. The housing provides a side wall. The TEC, which is installed within in the housing, mounts a semiconductor optical device thereon. The receptacle, which is provided in the side wall of the housing, receives an external optical connector with a ferrule, wherein this ferrule abuts against the deep end of the receptacle to cause impact to the TEC. A distinguishable feature of the optical sub-assembly of the present invention is that the bridge mechanically connects a top portion of the TEC to the housing. Thus, the TEC is not only fixed directly to the housing at the bottom plate thereof, but the top portion thereof is also mechanically fixed to the housing. The bridge thus configured may receive and absorb the moment of inertia caused by the impact of the ferrule abutting against the deep end of the receptacle, and the TEC may be prevented from breaking.

The bridge may mechanically connect a top of the TEC or a top surface of a carrier mounted on the TEC. The bridge may extend along a direction perpendicular to the optical axis of the optical sub-assembly which is substantially identical with the axis of the receptacle, or, the bridge may extend along the optical axis. Furthermore, the bridge may be arranged in an opposite side of the receptacle with respect to the TEC.

The optical sub-assembly may install an LD as the optical device, an LD driver to drive the LD electrically, and a block to mount the LD driver. The block is stiffly fixed to the housing. The bridge may mechanically connect the top portion of the TEC to the top surface of the block. Thus, the top portion of the TEC may be mechanically and indirectly connected to the housing through the bridge and the block, which may reduce and absorb the impact affected in the top portion of the TEC.

The bridge may be made of ceramic such as aluminum oxide ($Al_2O_3$) and aluminum nitride (AlN). Moreover, the bridge may provide one of a micro-strip line, a co-planar line, and a grounded micro-strip line to carry an electrical signal to the optical device.

The bridge may further have a width of at least 0.15 mm and a thickness of at least 0.1 mm to show enough stiffness against the impact caused by the ferrule abutting against the deep end of the receptacle.

BRIEF DESCRIPTION OF DRAWINGS

The invention may be more completely understood in consideration of the following detailed description of various embodiments of the invention in connection with the accompanying drawings, in which:

FIG. 3A is a plan view showing an optical sub-assembly according to the first embodiment of the present invention, while.

FIG. 4A is a plan view showing another optical sub-assembly according to the second embodiment of the present invention; while.

FIG. 6A is a plan view showing still another embodiment according to the present invention, and FIG. 6B is a cross section thereof taken along the line A-A in FIG. 6A.

DETAILED DESCRIPTION OF PREFERRED EMBODIMENTS

Next, some preferred embodiments according to the present invention will be described in detail. In the description of the drawings, the same elements will be referred by the same numerals or the symbols without overlapping explanations.

(First Embodiment)

Figure 1A:
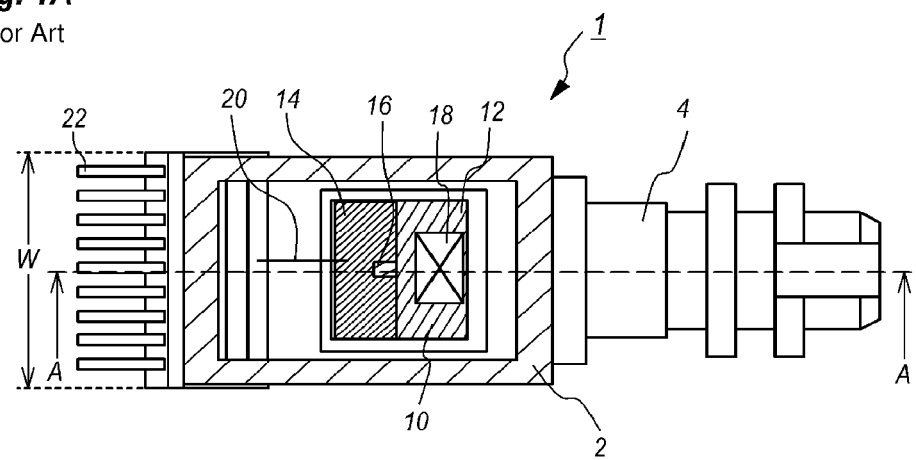
FIG. 1A is a plan view of a conventional optical sub-assembly.
Figure 1B:
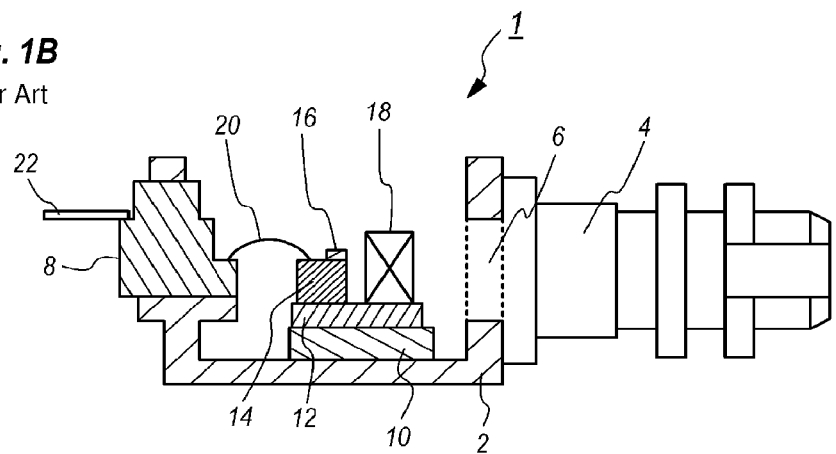
FIG. 1B is a cross section of the conventional optical sub-assembly, which is taken along the ling A-A appeared in FIG. 1A.

First, a conventional optical subassembly will be described as a comparative example. FIG. 1A is a plan view schematically showing an inside of the conventional optical sub-assembly 1, while, FIG. 1B is a cross section taken along the line A-A in FIG. 1A. These figures omit a ceiling set on the housing 2.

The optical sub-assembly 1, as shown in FIGS. 1A and 1B, comprises a housing 2, a thermo-electric cooler (hereafter denoted as TEC) 10 mounted on the bottom of the housing, a carrier 12 mounted on the TEC 10, a sub-mount 14 and a lens 18 each mounted on the carrier 12, and a semiconductor optical device 16 typically a semiconductor laser diode (hereafter denoted as LD) which is mounted on the sub-mount 14. The housing provides side walls one of which attaches a receptacle 4 thereto while another side wall facing the former side wall provides an insulating member 8. The TEC 10 may thermally couple with the LD 16 through the carrier 12 and the sub-mount 14 to control a temperature of the LD 16. The LD is optically coupled with an external fiber 23 inserted into the receptacle 4 such that a substantial coupling efficiency may be achieved. The light emitted from the LD 16 enters the external fiber 23 in the receptacle after being concentrated by the lens 18 and passing an aperture 6 formed in the side wall. The optical sub-assembly 1 thus configured is a type of a transmitter optical sub-assembly (TOSA).

The insulating member 8 provides an interconnection to which a bonding wire 20 and a lead pin 22 are connected thereto. The bonding wire 20 connects a wiring pattern formed on the sub-mount 14 to the interconnection of the insulating member 8. The LD 16 electrically couples with the interconnection on the insulating member 8 through the bonding wire 20 and the wiring pattern on the sub-mount 14; that is, the LD 16 may be driven by an electrical signal applied to the lead pin 22 through the interconnection on the insulating member 8, the bonding wire 20 and the wiring pattern on the sub-mount 14. Thus, the LD 16 may emit light modulated by the electrical signal thus provided thereto.

The housing 2 has a lateral width W of about 5 mm, which is taken in perpendicular to the optical axis of the optical sub-assembly 1; that is, the optical axis may be an axis connecting the LD 16 to the external fiber 23 in the receptacle. The receptacle 4 has a cylindrical shape, and the optical axis substantially identical with the axis of the cylinder of the receptacle 4. The housing 2 may be made of metal, while, the insulating member 8 may be made of, for instance, ceramics. The carrier 12 and the sub-mount may be made of metal such as copper tungsten (CuW) or ceramics such as aluminum nitride (AlN) showing preferable thermal conduction. The bonding wire 20 may be made of gold (Au), and the lead 22 may be made of copper (Cu) coated with gold. The TEC 10 is soldered on the bottom of the housing 2, the carrier 12 is soldered on the upper plate of the TEC 10, and the sub-mount 14 is soldered on the carrier 12. The lens 18 is fixed on the top surface of the carrier 12 by, for instance, welding.

Figure 2A:
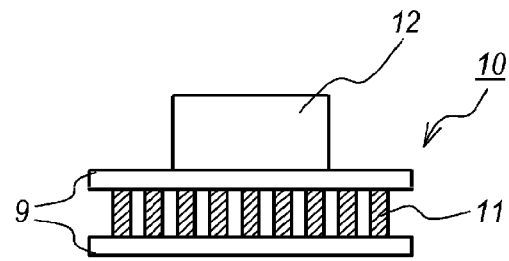
FIG. 2A schematically illustrates a structure of TEC.
Figure 2B:
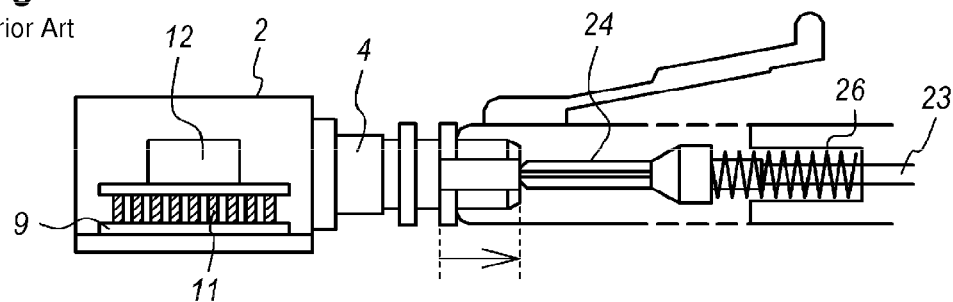
FIGS. 2B and 2C show processes when an external connector with a ferrule is inserted into the receptacle and causes impact to break the TEC.
Figure 2C:
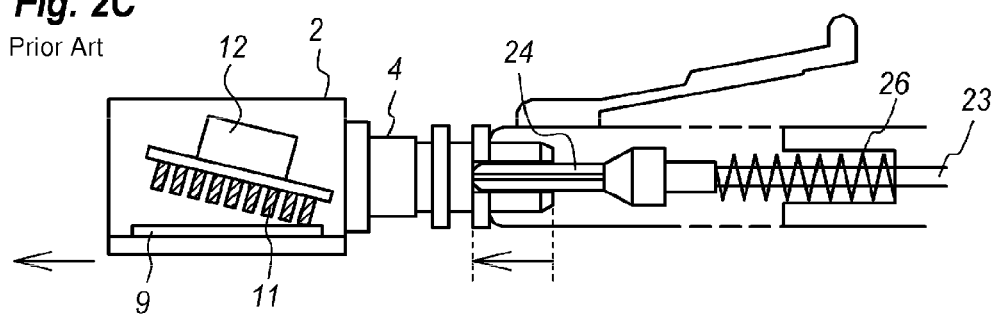

Next, a break of the TEC often encountered in the conventional optical sub-assembly will be described. FIG. 2A is a side view of the TEC 10, and FIGS. 2B and 2C are cross sections showing a process where the TEC 10 comes to the break. These figures omit the LD 16, the boding wire 20, and so on.

The TEC 10 comprises two insulating plates 9, and a plurality of thermo-electric elements (hereafter denoted as TE-elements) 11 put between two plates 9, as shown in FIG. 2A. The TE-elements are arranged on the lower plate 9 in order. Each TE-element includes an n-type semiconductor material and a p-type semiconductor material attached to each others.

When an external connector, typically a type of LC-connector, is inserted into the receptacle 4, a tip of a ferrule 24 provided in the external connector comes in contact to a tip of he receptacle as shown in FIG. 2B. In this instance, the tip of the ferrule 24 is prevented from being smoothly inserted into the sleeve in the receptacle, that is, the ferrule 24 is sometimes hooked by the tip of the receptacle 4, which compresses the coil spring 26 provided in behind of the ferrule 24 and reserves the great energy therein. Such an occasion often appears in an optical connector with lesser dimensional accuracy.

Releasing the hooking of the ferrule 24, the energy reserved in the coil spring 26 is released for the ferrule 24 to be inserted into the sleeve as receiving the elastic force from the coil spring 26 which accelerates the motion of the ferrule 24 toward the direction of the arrow shown in FIG. 2C. The accelerated ferrule 24 abuts against the deep end of the sleeve of the receptacle 4, which gives the great impact to the housing 2 of the module 1.

The impact affected on the housing 2 is transferred to the TEC 10 as the moment of the inertia, which sometimes breaks the TEC 10. In particular, when the TEC 10 installs TE-elements 11 with a smaller cross section or the number of TE-elements provided in the TEC 10 is relatively few, which results in lesser durability, the TEC 10 may be often broken.

Figure 3A:
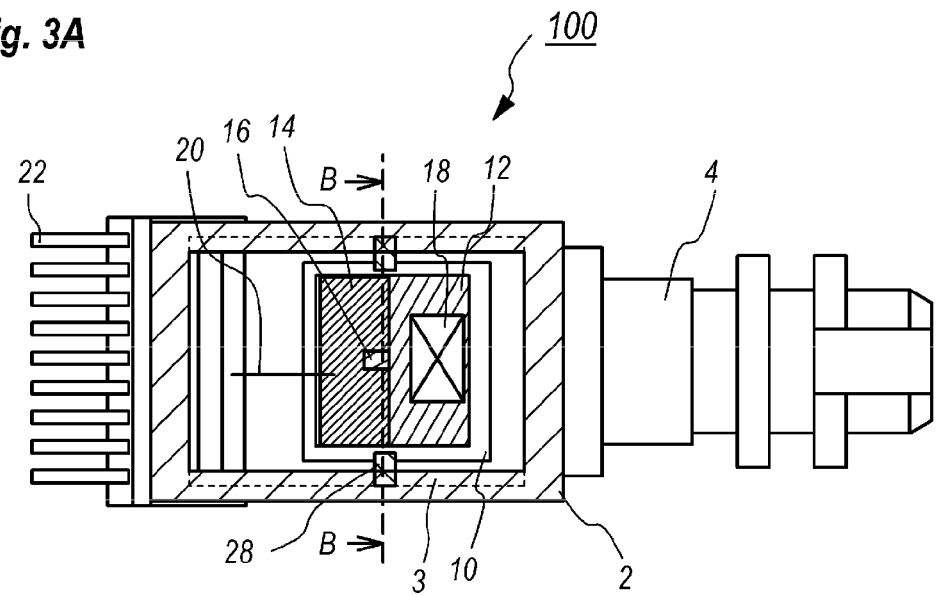
Figure 3B:
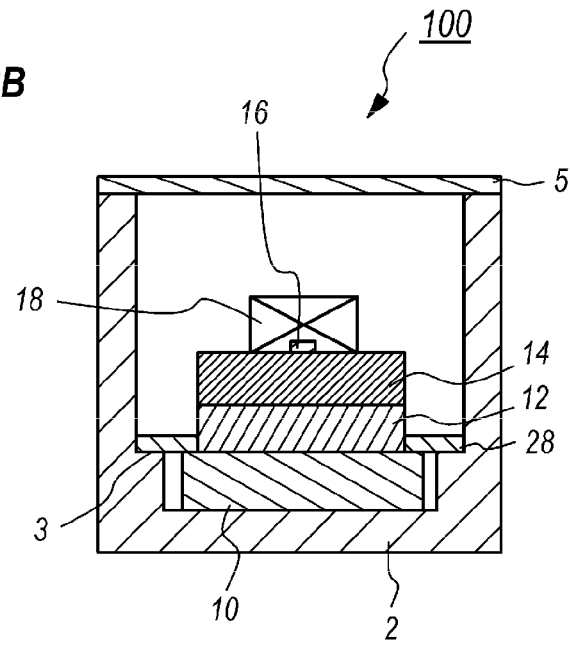
FIG. 3B is a cross section of the optical sub-assembly, which is taken along the line B-B appeared in FIG. 3A.

Next, the optical sub-assembly 100 according to the present embodiment will be described. FIG. 3A is a plan view showing the optical sub-assembly 100, while, FIG. 3B is a cross section thereof taken along the ling B-B in FIG. 3A.

The optical sub-assembly 100 provides a bridge 28 that mechanically connects the top of the TEC 10 and a step 3 formed in the side wall of the housing 2. The bridge 28 shown in figures has a width of about 0.17 mm, a thickness of about 0.12 mm and a length of about 0.5 mm. The bridge 28 is preferably greater than 0.15 mm in a width and preferable greater than 0.1 mm in a thickness thereof for securing the substantial durability. The bridge 28 may be made of ceramics such as aluminum oxide ($Al_2O_3$) and aluminum nitride (AlN). The bridge 28 may be soldered to the top of the TEC 10 and also to the step 3.

The description presented below refers to an area in the top of the TEC 10 where the bridge 28 is mechanically connected thereto as the first area, while, another area in the step 3 where the bridge 28 is also mechanically connected as the second portion. The first area may be mechanically coupled with the top of the TEC 10, and the second portion may be mechanically coupled with the housing 2.

According to the present embodiment which installs the bridge 28 in the optical sub-assembly, the TEC 10 in both the top and bottom plates 9 are mechanically connected to the housing 2. Accordingly, even when the housing receives the impact from the irregularly inserted ferrule 24, the impact may be transferred to both the top and bottom plates of the TEC 10, which prevents the TEC 10 from receiving the great moment of inertia. Thus, The TEC 10 may be prevented from breaking.

The bridge 28 may be made of material with lesser thermal conductivity because the inflow through the bridge 28 causes the undesired temperature fluctuation in the LD 16. At the same time, the bridge 28 may be made of material with greater stiffness to show the great durability for the impact by the ferrule 24. Thus, the bridge 28 may be made of ceramics but not limited to those materials. In this case, the bridge 28 may provide on the top surface thereof an interconnection with an arrangement of the micro-strip line or the co-planar line electrically connecting the LD 16 with the lead pin 22 formed in the step 3. The bridge may be made of metal or glass, while, the bonding wire 20 may be a ribbon wire.

(Second Embodiment)

Figure 4A:
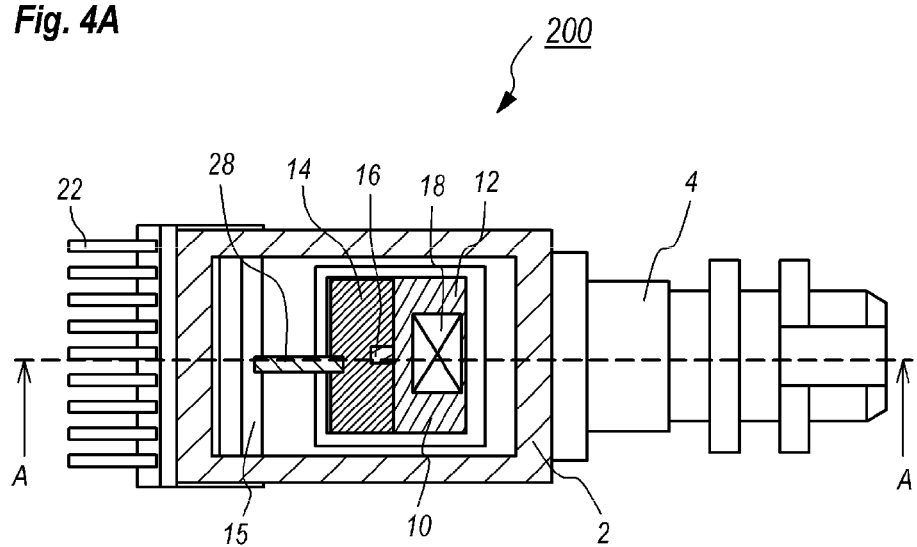
Figure 4B:
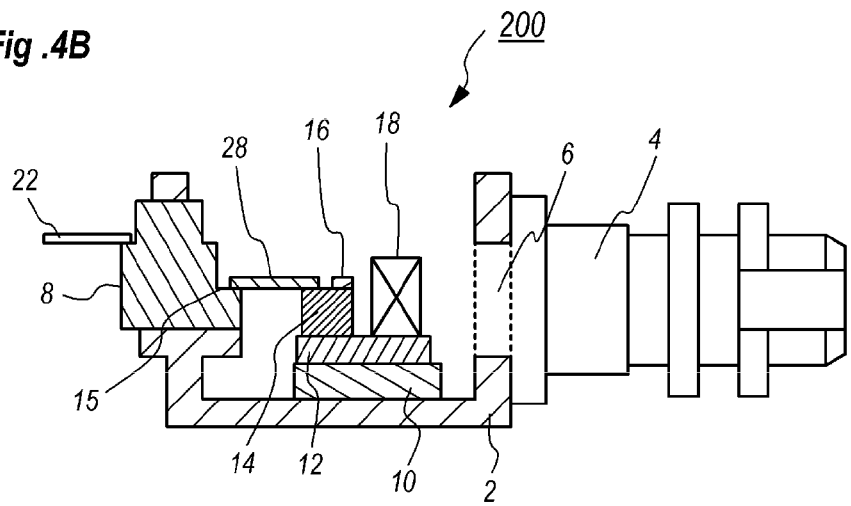
FIG. 4B is a cross section thereof taken along the line A-A in FIG. 4A.

Next, the second embodiment according to the present invention will be described. FIG. 4A is a plan view showing an optical sub-assembly 200 according to the second embodiment, while, FIG. 4B is a cross section of the optical sub-assembly 200, which is taken along the lint B-B appeared in FIG. 4A.

The optical sub-assembly 200 also provides the bridge 28 similar to those in the first embodiment shown in FIGS. 3A and 3B; but the extending direction of the bridge 28 in the second embodiment is along, or substantially in parallel, to the optical axis of the optical sub-assembly 200 arranged in an opposite side of the optical receptacle 4 putting the TEC 10 therebetween, which is a feature of the optical sub-assembly 200 and different from those in the first embodiment. The bridge 28 mechanically connects the top of the sub-mount 14 to the step 15 in the insulating member 8. The bridge 28 may mechanically connect the top of the sub-mount 14 to the step formed in the side wall of the housing 2.

Similar to those in the first embodiment shown in FIGS. 3A and 3B, the first area may be assumed to be a portion of the top of the sub-mount 14 which is mechanically connected to the bridge 28, while, the second portion may be assumed to be a portion on the step 15 in the insulating material 8, which is mechanically connected to the bride 28.

Figure 5:
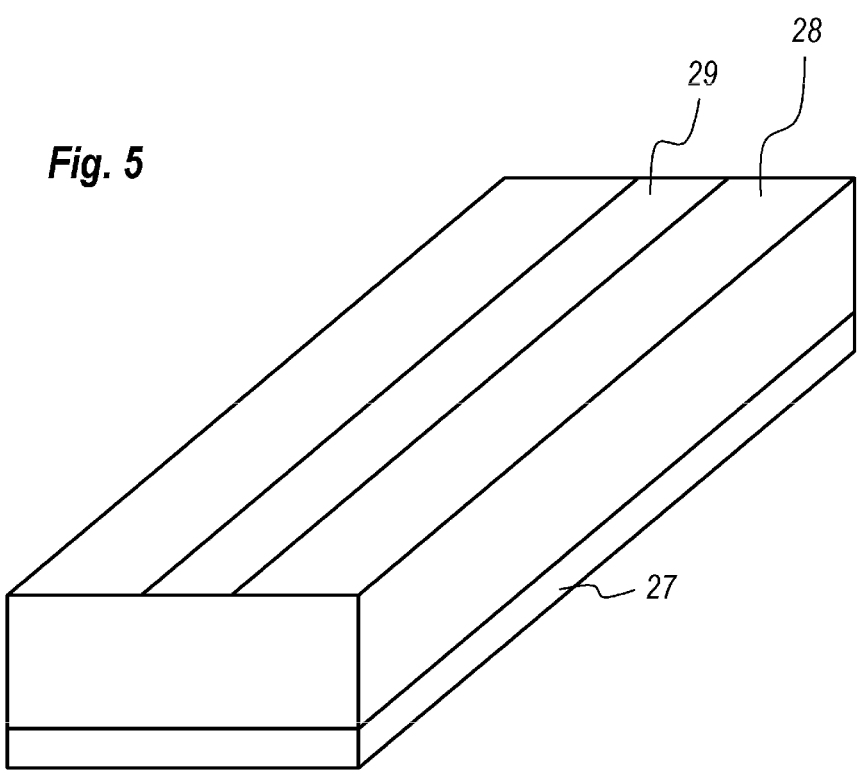
FIG. 5 is a perspective view of the bridge installed in the optical sub-assembly of the present invention.

Details of the bride 28 according to the present embodiment will be further described. FIG. 5 is a perspective view of the bride 28.

The bridge 28 provides a metal interconnection 29 in the top surface thereof, while a metal film 27 in the bottom. The metal interconnection 29 and the metal file 27 may be made of gold (Au). The body of the bridge 28 may be made of ceramics such as aluminum oxide ($Al_2O_3$) and aluminum nitride (AlN). This arrangement of the bridge 28 shows a function of the micro-strip line. The bridge 28 may have a dimension of 0.17 mm in width, 0.12 mm in thickness, and 0.5 mm in length; the bridge 28 preferably has a width greater than 0.15 mm and a thickness greater than 0.1 mm to show enough stiffness against the impact by the ferrule 24.

Referring to FIG. 4A again, the LD 16 may be electrically connected to the lead 22 through the bonding wire 20, the wiring pattern on the sub-mount 14, the bridge 28, and the interconnection, in the insulating member 8. In this arrangement, not only the bottom plate of the TEC 10 but the top plate thereof may be mechanically connected to the housing 2; accordingly, the durability against the moment of the inertia caused by the impact of the ferrule 24 may be enhanced and the TEC 10 may be prevented from breaking. The bridge 28 in the present embodiment extends along or substantially in parallel to the inserting direction of the ferrule 24 in the receptacle 4, which effectively restrains, compared with the arrangement of the bridge 28 in the first embodiment, the moment of the inertia caused in the top of the TEC 10.

Furthermore, the bridge 8 is arranged inside opposite to the receptacle 4 with respect to the TEC 10. In other words, the first and second portions mentioned above are arranged in the side opposite to the receptacle 4 putting the TEC 10 therebetween. The bridge 28 in the arrangement of the second embodiment simply receives the compressive stress from the TEC 10 because it is arranged in the opposite side to the receptacle 4 viewed in the TEC 10, while, the bridge in the first embodiment receives a complex stress of the compressive and tensile force which introduces a twisted motion in the bridge 28. Accordingly, the bridge 28 in the second embodiment may show the greater durability against the motion of inertia of the TEC 10 due to the impact of the ferrule 24.

The interconnection provided on the bridge 28 is not restricted to the micro-strip line shown in FIG. 5, and a coplanar line and the like may be formed in the bridge 28. Moreover, the bridge 28 may provide no interconnection, but only shows the function, to enhance the durability of the TEC 10 against the impact of the ferrule 24. That is, only the function to reinforce the top of the TEC 10 mechanically is to be provided in the bridge 28. Surplus connections to the top of the TEC 10, whether the connections are mechanical or electrical, should be avoided because of the inflow of heat through the connections, which fluctuates the temperature of the top of the TEC 10. Accordingly, the bridge 28 preferably provides the electrical interconnection, in particular, the bridge 28 provides a micro-strip line or a co-planar line when the operational speed of the optical sub-assembly reaches and exceeds 10 GHz.

(Third Embodiment)

Next, the third embodiment according to the present invention will be described. FIG. 6A is a plan view of an optical sub-assembly 300 according to the third embodiment of the invention, while, FIG. 6B is a cross section taken along the line A-A in FIG. 6A.

The optical sub-assembly 300 shown in FIGS. 6A and 6B has a distinguishable feature compared with those in the aforementioned embodiments that the optical sub-assembly 300 provides a block 30 to mount an laser diode driver (hereafter denoted as LDD) 32. The block 30 may be arranged behind the LD 16, that is, the insulating member 8, the block 30, and the TEC 10 with some components, 12 and 14, and the LD 16 thereon through the chip carrier 38, and the receptacle 4 are arranged in this order along the optical axis of the optical sub-assembly 300. The block 30, which is apart from the TEC 10, also mounts substrates, 34 and 36. The former substrate 34 provides two wiring patterns 35 thereon that carry a differential electrical signal to the LDD 32. The other substrate 36 also provides an interconnection on the top surface thereof.

The bridge 28 of the present embodiment mechanically connects the top of the block 30 to the top of the sub-mount 14. The bridge 28 has a width of, for instance, 0.17 mm, a thickness of, for instance, 0.12 mm, and a length of about 2.0 mm. These dimensions may be varied in respective optical sub-assemblies. However, the width of the bridge 28 may be at least 0.15 mm and the thickness thereof may be at least 0.1 mm for securing enough stiffness.

Similar to those in aforementioned embodiments, the first area is assumed to be a portion in the top of the sub-mount where the bridge 28 is attached thereto, while, the second area is assumed to be a portion in the top of the block 30 where the bridge 28 is attached thereto. Thus, the first area may be mechanically connected to the top of the TEC 10, while, the second area may be mechanically connected to the housing 2 through the block 30.

The LD 16 may be electrically connected to the LDD 32 through the interconnection of the chip carrier 38, the bonding wire 37, the bridge 28, the interconnection on the substrate 36, while, the LDD 32 may be electrically connected the lead pin 22 through the interconnections 35 on the substrate 34, the bonding wire 20, and the wiring pattern on the insulating member 8. The bonding wire connecting the chip carrier 38 to the bridge 28, that connecting the bridge 38 to the interconnection on the substrate 36, that connecting the interconnection of the substrate 36 to the LDD 32, that connecting LDD 32 to the substrate 34, and that connecting the substrate 34 to the wiring pattern on the insulating member may be replaced to respective ribbon wires. The differential signal applied to the lead pin 22 may be received by the LDD 32 and converted into a single phase signal. This single phase signal may modulate the LD 16.

The block 30 may be made of metal such as copper tungsten (CuW) or ceramics such as aluminum nitride (AlN) that effectively dissipates heat generated in the LDD 34 to the housing 2. That is, the block may show a function of a heat sink.

The optical sub-assembly 300 in the present embodiment may mechanically connect the top of the TEC 10 to the block 30 by the bridge 28 and the block 30 is firmly fixed to the housing 2; accordingly, the arrangement of the top of the TEC 10, the bridge 28 and the block 30 may effectively enhance the durability of the TEC against the moment of inertia due to the impact of the ferrule 24. Furthermore, the block 30 is arranged behind the TEC 10 similar to the arrangement of the previous module 200, which may further effectively prevent the TEC 10 from breaking.

Because the bridge 28 provides the micro-strip line with the ground metal in the back surface thereof, which is called as the grounded micro-strip line, the bridge 28 may enhance not only the robustness of the TEC 10 but the cost advantages. The bridge 28 in the configuration thereof is not restricted to the micro-strip line, the co-planar line, and the grounded micro-strip line with a base made of ceramics. Only the ceramics without any electrical interconnections may enhance robustness against the moment of inertia due to the impact of the ferrule 24.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An optical sub-assembly, comprising:
    a housing with a side wall;
    a thermo-electric controller (TEC) installed in said housing, said TEC mounting a semiconductor laser diode thereon;
    a receptacle provided in said side wall of said housing, said receptacle receiving an external optical connector with a ferrule abutting against a deep end of said receptacle to cause an impact to said TEC;
    a block for mounting a laser diode driver on a top surface thereof and being stiffly fixed to said housing behind said TEC with respect to said receptacle, said laser diode driver driving said semiconductor laser diode; and
    a bridge extending along an optical axis of said optical sub-assembly and mechanically connecting a top portion of said TEC to said top surface of said block, said bridge being made of ceramics.

2. The optical sub-assembly of claim 1,
    wherein said TEC comprises a top plate, a bottom plate and a plurality of thermo-controlling elements,
    wherein said bridge is mechanically connected to a top surface of a member mounted on said top plate of said TEC.

3. The optical sub-assembly of claim 2, wherein said member is a carrier mounted on said top plate of said TEC.

4. The optical sub-assembly of claim 1, wherein said bridge has a thickness of at least 0.1 mm.

5. The optical sub-assembly of claim 1, wherein said bridge has a width of at least 0.15 mm.

* * * * *